United States Patent
Byrne et al.

(10) Patent No.: US 6,211,676 B1
(45) Date of Patent: Apr. 3, 2001

(54) MRI MAGNETS

(75) Inventors: Alex Francis Byrne, Caversham; Nicholas David Parker, Leamington Spa; Francis John Davies, Kidlington, all of (GB)

(73) Assignee: Oxford Magnet Technology Limited, Oxon (GB)

(*) Notice: Subject to any disclaimer, the term of this patent is extended or adjusted under 35 U.S.C. 154(b) by 0 days.

(21) Appl. No.: 08/815,188

(22) Filed: Mar. 11, 1997

(30) Foreign Application Priority Data

Mar. 20, 1996 (GB) .................................. 9605804

(51) Int. Cl.⁷ .................................................. G01V 3/00
(52) U.S. Cl. ............................................ 324/319; 324/320
(58) Field of Search ...................... 324/319, 320, 324/318, 307, 309, 312; 335/216, 296, 299; 600/421

(56) References Cited

U.S. PATENT DOCUMENTS 5,315,276 * 5/1994 Huson et al. ...................... 335/216
5,345,208   9/1994 Dorri et al. ..
5,347,252   9/1994 Ries .
5,378,988   1/1995 Pulyer .

FOREIGN PATENT DOCUMENTS 2282451    4/1992 (GB) .
2284061    5/1995 (GB) .
WO93/15514 8/1993 (WO) .

* cited by examiner

*Primary Examiner*—Louis Arana
(74) *Attorney, Agent, or Firm*—Evenson, McKeown, Edwards & Lenahan, P.L.L.C.

(57) ABSTRACT

An open electromagnet including a pair of field coils which respectively comprise juxtaposed poles of the electromagnet between which an imaging volume of substantially homogeneous magnetic field is defined, toroidal shielding coil means arranged on a locus which forms a loop, so that when energized, the said shielding coil means produces a controlling magnetic field which configures a magnetic flux return path for the field coils so that the magnetic flux return path describes the said loop, and a support structure which serves rigidly to support the shielding coil means and the field coils.

12 Claims, 2 Drawing Sheets

MRI MAGNETS

This invention relates to electromagnets for use in magnetic resonance imaging (MRI) systems and in particular to magnets which are open, i.e., magnets in which an imaging volume wherein that portion of a patient being imaged is positioned is not surrounded by the magnet.

A special requirement for MRI is a strong uniform magnetic field, typically 0.2 to 2 Tesla, with a field homogeneity of a few parts per million in the imaging volume, typically a sphere of 30 cm to 50 cm in diameter. Most commonly such a field is produced by an electromagnet having a solenoid construction but this necessitates a patient being surrounded by the magnet and enclosed within a tube, which can cause a feeling of claustrophobia and limit access to a patient as may be required for some surgical or diagnostic procedures. However by using open magnets, to which this invention particularly relates, these problems are overcome.

Open electromagnets for use in MRI systems are well known. One known form of electromagnet comprises a pair of juxtaposed magnetic poles of opposite polarity between which the imaging volume is defined, which poles are linked and supported by a yoke which provides a magnetic flux return path and which principally comprises a generally C-shaped steel frame. Because large amounts of steel are required, these known C-shaped magnets are very heavy, especially for high field magnets which require many tons of steel to define the flux return path.

Very heavy magnets may cause problems with manufacture, transport, installation and maintenance as will be readily appreciated.

It is therefore an object of the present invention to provide an MRI system comprising an open electromagnet wherein the requirement for large amounts of steel, which adds undesirably to the weight of the system, is obviated.

According to the present invention an open electromagnet includes a pair of field coils which respectively comprise juxtaposed poles of the electromagnet between which an imaging volume of substantially homogeneous magnetic field is defined, toroidal shielding coil means arranged on a locus which forms a loop, so that when energized, the said shielding coil means produces a controlling magnetic field which configures a magnetic flux return path for the field coils so that the magnetic flux return path describes the said loop, and a support structure which serves rigidly to support the shielding coil means and the field coils.

The shielding coil means may in accordance with one aspect of the invention comprise a plurality of toroidal shielding coils arranged in spaced apart relationship on a common locus which describes the loop.

The toroidal shielding coils may be substantially identical to each other.

Alternatively, in accordance with another aspect of the invention, the shielding coil means may comprise a single, continuously wound, toroidal shielding coil which describes the loop.

By using the toroidal shielding coil means to configure the magnetic flux return path of magnetic flux produced by the field coils, the need for heavy steel yoke components which might otherwise be required to define the return path is obviated.

The electromagnet may be a superconducting electromagnet wherein the shielding coils and the field coils are contained in a cryostat maintained at a temperature close to absolute zero.

This low temperature may be achieved by immersing the coils within the cryostat in liquid helium and/or by using a two stage refrigerator and heat shields to which respective stages are thermally coupled.

The electromagnet may be a C-shaped electromagnet wherein the common locus defines a single loop which includes the magnetic flux return path and which is closed by a region between the juxtaposed poles which includes the imaging volume.

The support structure may be fabricated of non-magnetic material such as aluminium for example.

The magnetic field in the imaging volume may be finely adjusted to achieve high homogeneity by means of a plurality of pieces of magnetic material supported on a pair of non-magnetic plates positioned adjacent respective poles so that diametrical axes of the plates lie orthogonal to the direction of lines of flux passing between the said poles.

The open electromagnet may form a part of an MRI system which includes gradient coils and other components for magnetic resonance imaging as are well known to those skilled in the art.

One embodiment of the invention will now be described solely by way of example with reference to the accompanying drawings, wherein;

FIG. 1 is a generally schematic sectional side view of a C-shaped electromagnet which forms a part of an MRI system and wherein;

Figure 1:
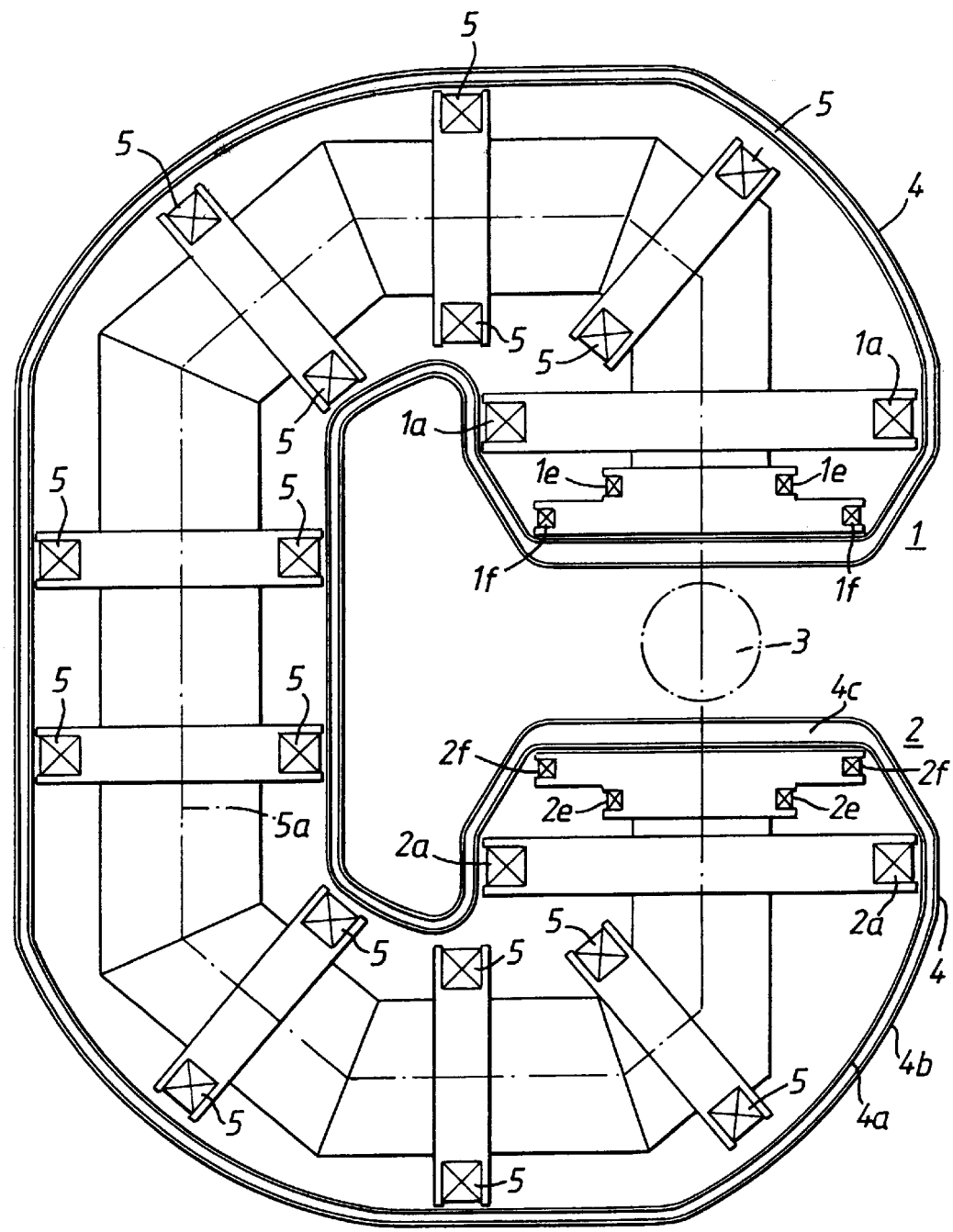
Figure 2:
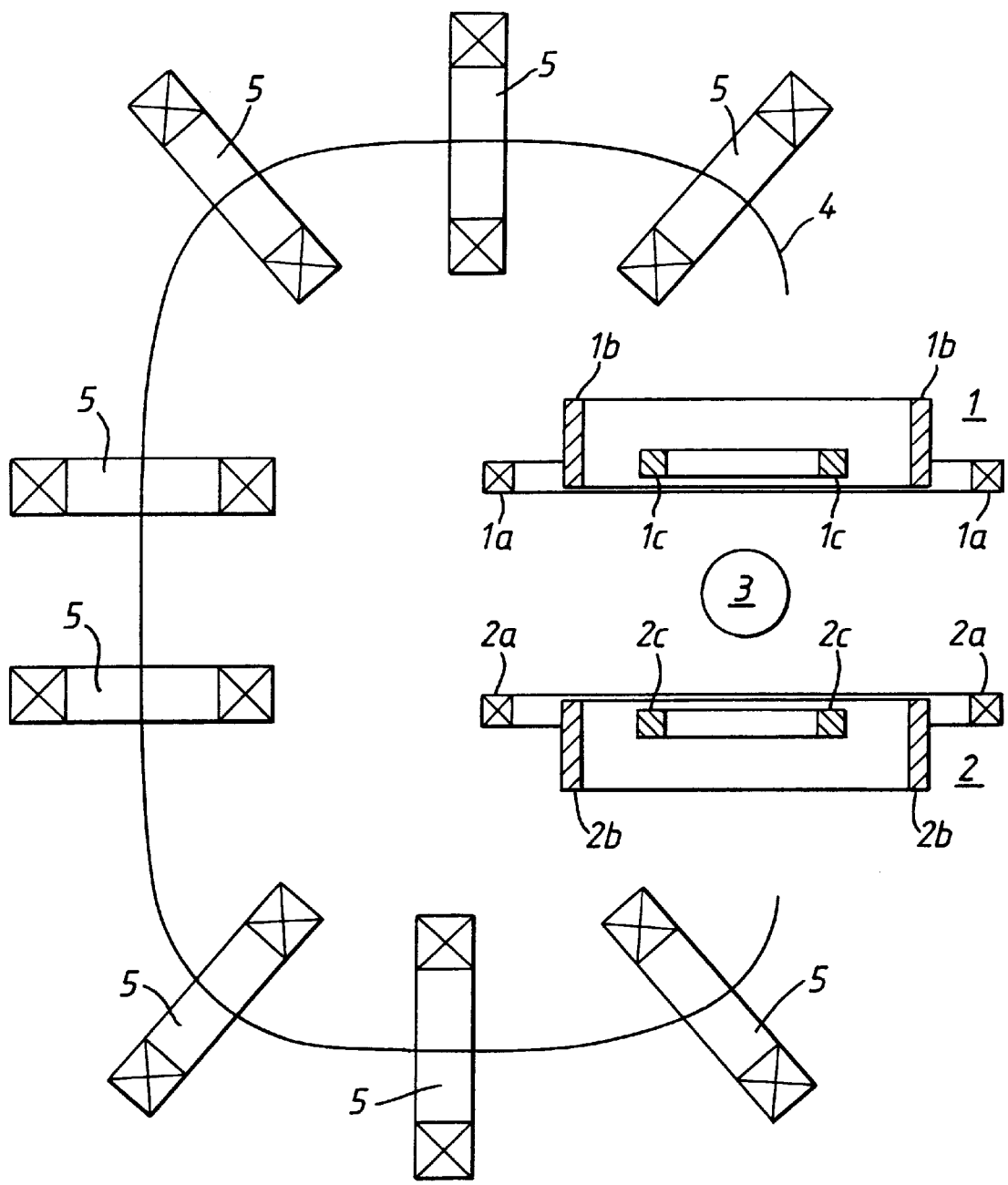
FIG. 2 is a somewhat schematic sectional side view of shielding coils and field coils which form a part of an alternative electromagnet which is similar in many respects to the electromagnet shown in FIG. 1.

Referring now to FIGS. 1 and 2, a C-shaped open electromagnet for use in an MRI system comprises a pair of coaxially disposed juxtaposed electromagnet poles 1 and 2, of opposite polarity between which an imaging volume 3 of substantially homogeneous magnetic field is defined. The poles 1 and 2 are contained within and supported by a cryostat 4 of non-magnetic material which is filled with liquid helium and which comprises inner and outer walls 4a and 4b respectively having between them an evacuated region 4c. In order to constrain and configure return magnetic flux which flows between the poles 1 and 2 a plurality of toroidal shielding coils 5 are provided, which may be connected in series so that the imaging magnetic field and the shielding magnetic field are generated by the same current. The shielding coils 5 are arranged on a common locus which forms a loop so that when they are energized they produce a controlling magnetic field which serves to constrain and configure the magnetic flux in the return path between the poles 1 and 2 as shown schematically. The locus of the loop which links the centres of the shielding coils 5 does not pass through the centre of the poles 1 and 2, but is displaced outwardly. The reason for this displacement is that there is some leakage flux from the return path into the imaging volume 3 which increases the magnetic field on the side nearest the return. By offsetting the locus of the loop with respect to the centres of the poles 1 and 2 this effect can be compensated, i.e. flux injected into the imaging volume 3 from ends of the return path is concentrated on the side furthest from the return. As herein- before explained, although in the present example a plurality of generally similar toroidal shielding coils 5 are used, in one contemplated alternative arrangement a single continuously wound toroidal coil may be used, and in this case flux leakage will be much less and so the required offset of the locus from the pole centres will be much less and may even be zero.

By using toroidal shielding coils to define a loop and by appropriately energizing the shielding coils, flux in the magnetic return path between the poles 1 or 2 is constrained and configured to follow the loop so that stray magnetic fields outside the electromagnet are minimal, whereby the need for additional magnetic field screening is obviated, and so that the need for large amounts of iron which might otherwise be required to define the flux return path is also obviated.

The poles 1 and 2 comprise driving coils 1a and 2a respectively which in the electromagnet of FIG. 2, are operatively associated with iron rings 1b, ic and 2b, 2c respectively. However in an alternative arrangement as shown in FIG. 1, the iron rings are replaced by pairs of concentric coils 1e, 1f and 2e, 2f which are simply connected in series with the driving coils 1a and 2a respectively.

Multiple coils or iron rings or combinations of both may be used to cancel out higher order terms in the magnetic field to achieve a very high degree of magnetic flux homogeneity in the imaging volume. If coils are used, some of them may be connected in reverse so that the current opposes the current in the main coils. Furthermore, the centres of these coils or rings may be displaced from one another, in the same way that the locus is offset from the centre of the poles 1 and 2, in order to compensate for the effects of leakage flux.

The required magnetic flux homogeneity will normally be achieved by the foregoing, and other design considerations, for example, so that any shimming system used is required for fine tuning only to compensate for manufacturing tolerances.

In this connection, although not shown in the drawing, magnetic flux in the imaging volume 3 may be adjusted to produce a very high degree of homogeneity by the inclusion of a plurality of pieces of magnetic shimming material which are supported on a pair of non-magnetic plates associated respectively with the field coils 1 and 2 and positioned so that the diametrical axes of the plates lie orthogonal to the direction of lines of flux passing between the poles 1 and 2 in the imaging volume 3. The magnetic material used for shimming may be soft iron or laminated steel or it may be permanent magnet material such as samarium cobalt or neodymium iron boron which has the advantage that it can be used in both positive and negative orientations.

Although not shown in the drawings, when used for MRI purposes the electromagnet will be operatively associated with gradient coils and RF coils, as required for MRI imaging and which are well known to those skilled in the art.

Various modifications may be made to the arrangements shown in the drawing and for example it is contemplated that the invention may equally well be applied to other open electromagnet designs wherein for example a plurality of parallel magnetic flux return path loops are provided each loop being defined by a plurality of toroidal shielding coils substantially as shown in the drawings.

It will also be appreciated that cryostat designs may be utilised having one or more heat shields which may be refrigerated to minimise helium boil-off. The windings may be cooled in liquid helium and/or by a two stage refrigerator, each stage being coupled to a heat shield, the two heat shields being arranged one within the other and arranged to enshroud the cryostat in which the windings are contained. If conventional Niobium-Titanium superconductors are used for the windings, a special refrigerator would be required to achieve a temperature close to 4K and such a device is commercially available. For other superconducting material which will operate at a slightly higher temperature, conventional Glifford McMahon refrigerators can be used. Some such arrangements are well known to those skilled in the art and accordingly will not be described in detail herein since they are not central to the present invention, and other such arrangements are described in our co-pending patent applications.

We claim:

1. An open electromagnet including a pair of field coils which respectively comprise juxtaposed poles of the electromagnet between which an imaging volume of substantially homogeneous magnetic field is defined, toroidal shielding coil means arranged on a locus which forms a loop so that when energized, the said shielding coil means produces a controlling magnetic field which configures a magnetic flux return path for the field coils so that the magnetic flux return path describes the said loop, and a support structure which serves rigidly to support the shielding coil means and the field coils, wherein the shielding coil means comprises a plurality of toroidal shielding coils arranged in spaced apart relationship on a common locus which describes the loop.

2. An electromagnet as claimed in claim 1 wherein the toroidal shielding coils are substantially identical to each other.

3. An electromagnet as claimed in claim 1 wherein the shielding coils and the field coils are contained in a cryostat maintained at a temperature close to absolute zero.

4. An electromagnet as claimed in claim 3 wherein the coils are immersed within the cryostat in liquid helium.

5. An electromagnet as claimed in claim 4 comprising a two stage refrigerator and heat shields to which respective stages are thermally coupled.

6. An electromagnet as claimed in claim 1 which is a C-shaped electromagnet wherein the common locus defines a single loop which includes the magnetic flux return path and which is closed by a region between the juxtaposed poles which includes the imaging volume.

7. An electromagnet as claimed in claim 1 wherein the support structure is fabricated of non-magnetic material.

8. An electromagnet as claimed in claim 1 comprising multiple coils or iron rings or combinations of both used to cancel out higher order terms in the magnetic field to achieve a high degree of magnetic flux homogeneity in the imaging volume.

9. An electromagnet as claimed in claim 8 comprising multiple coils at least some of which are connected so that the current therein opposes the current in the main coils.

10. An electromagnet as claimed in claim 9 wherein the centre of the multiple coils or rings is displaced to compensate for the effects of leakage flux.

11. An electromagnet as claimed in claim 1 wherein in order to produce a high degree of flux homogeneity in the imaging volume, a plurality of pieces of magnetic material are included, supported on a pair of non-magnetic plates positioned adjacent respective poles so that diametrical axes of the plates lie orthogonal to the direction of lines of flux passing between the said poles.

12. An MRI system including an electromagnet as claimed in claim 1 which system includes gradient coils and RF coils for magnetic resonance imaging.

* * * * *